United States Patent [19]
Hara

[11] Patent Number: 5,831,304
[45] Date of Patent: Nov. 3, 1998

[54] SEMICONDUCTOR MEMORY DEVICE THAT CONVERGES A FLOATING GATE THRESHOLD VOLTAGE TO A PREDETERMINED POSITIVE VALUE DURING DATA ERASURE

[75] Inventor: Hideki Hara, Tokyo, Japan

[73] Assignee: NEC Corporation, Tokyo, Japan

[21] Appl. No.: 706,531

[22] Filed: Sep. 4, 1996

[30] Foreign Application Priority Data

Sep. 14, 1995 [JP] Japan ................................ 7-262453

[51] Int. Cl.$^6$ .................................................. H01L 29/788
[52] U.S. Cl. .......................... 257/316; 257/315; 257/321
[58] Field of Search .................... 257/315, 316, 257/317, 321

[56] References Cited

U.S. PATENT DOCUMENTS

| | | | |
|---|---|---|---|
| 5,378,909 | 1/1995 | Chang et al. | 257/316 |
| 5,468,991 | 11/1995 | Hsu | 257/316 |
| 5,477,072 | 12/1995 | Goo | 257/616 |
| 5,574,685 | 11/1996 | Hsu | 365/185.18 |

*Primary Examiner*—Ngân V. Ngô
*Attorney, Agent, or Firm*—Young & Thompson

[57] ABSTRACT

The semiconductor memory device includes a first conductivity type semiconductor substrate, a tunnel gate oxide film formed on the semiconductor substrate, a floating gate formed on the tunnel gate oxide film, and a control gate formed on the floating gate. The semiconductor substrate includes second conductivity type source and drain regions, a second conductivity type lightly doped region formed so that it covers the source region, and a first conductivity type heavily doped region formed so that it covers at least the drain region and overlaps at least partially with the lightly doped region beneath the floating ate. The semiconductor memory device prevents excessive data erasure regardless of the dispersion in thickness of the tunnel gate oxide film, thereby preventing misreading and enhancing reliability of operation.

12 Claims, 8 Drawing Sheets

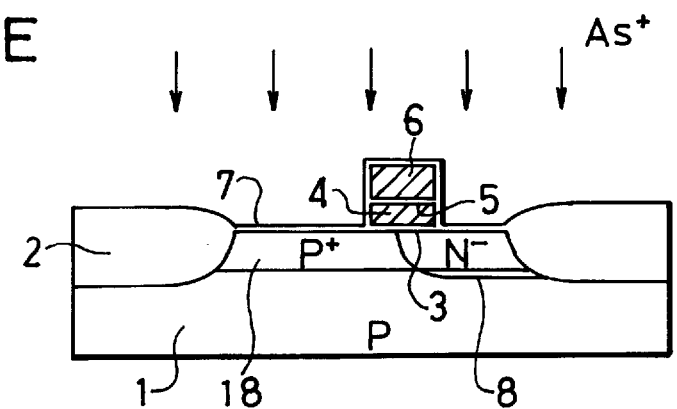
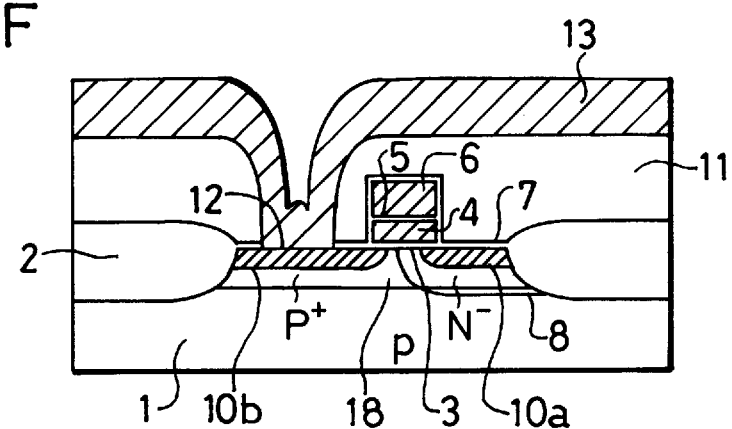

SEMICONDUCTOR MEMORY DEVICE THAT CONVERGES A FLOATING GATE THRESHOLD VOLTAGE TO A PREDETERMINED POSITIVE VALUE DURING DATA ERASURE

BACKGROUND OF THE INVENTION

1. Field of the Invention

The invention relates to a non-volatile semiconductor memory device such as an electrically programmable read only memory (EPROM) and a flash memory, and also to a method of fabricating the same.

2. Description of the Related Art

EPROM and a flash memory have been suggested as a non-volatile memory device having a function of not erasing data stored therein even if power for working the memory device is shut off. In particular, since a flash memory is capable of electrically writing data thereinto and electrically erasing stored data, a flash memory has been widely used in place of magnetically recording medium.

An example of a flash memory is illustrated in FIG. 1. As illustrated, a p-type silicon substrate 1 is formed therein with a p- -type well 17 for the purpose of prevention of punch-through. A tunnel gate oxide film 3 is formed on a part of a surface of the p-type silicon substrate 1. On the tunnel gate oxide film 3 is formed a layered-structure including a floating gate 4 formed on the tunnel gate oxide film 3 and made of polysilicon into which impurities such as phosphorus are implanted, an intergate insulating film 5 constituted of a layered-structure of oxide film/nitride film/oxide film, and a control gate 6 having a polycide structure composed of polysilicon and refractory metal silicide.

In the p- -type well 17, there are formed heavily doped N+ diffusion layer regions 10a and 10b as source and drain regions, respectively. The source region 10a is covered therebeneath with a lightly doped N- diffusion layer region 8. The above mentioned layered-structure including the layers 4, 5 and 6 and a surface of the silicon substrate 1 are covered with a thermal oxide film 7, on which is deposited an interlayer insulating film 11 including phosphorus and boron. A contact hole 12 is formed throughout the interlayer insulating film 11 and the thermal oxide film 7, and reaches a surface of the silicon substrate 1. A wiring 13 made of metal such as aluminum is deposited over the interlayer insulating layer 11, and fills the contact hole 12 therewith.

In a flash memory as illustrated in FIG. 1, when data is to be written into the flash memory, a high voltage is applied across the source and drain regions 10a and 10b to thereby introduce hot electrons into the floating gate 4. Thus, the floating gate 4 to which hot electrons have been supplied can have a different threshold voltage from that of memories to which hot electrons are not supplied. Hence, it is possible to read out data by applying a reference voltage to the memories and detecting whether the memories are conductive or non-conductive.

When data stored in a flash memory is to be erased, a high voltage is applied to a source line which is connected to all the memories to thereby remove electrons present in the floating gate 4 by virtue of Fowler-Nordhime (F-N) tunnel phenomenon. Thus, the above mentioned threshold voltage is returned back to an initial voltage.

As mentioned above, the erasion of data in a conventional semiconductor memory device is accomplished by removing electrons through a thin tunnel gate oxide film 3 in an overlapping region of the floating gate 4 and the N+ diffusion layer region or source region 10a by virtue of F-N tunnel effects. However, if there is a dispersion in fabrication of the tunnel gate oxide films 3, excessive erasion may take place. This is explained more specifically as follows. When data stored in high capacity memory cells are to be all erased, a high voltage is uniformly applied to all memory cells. However, if there is a difference in a thickness of the tunnel gate oxide film 3 of each of memory cells due to fabrication dispersion, electrons are excessively removed out of a floating gate in a memory cell which happens to have a thin tunnel gate oxide film. Thus, such a memory cell is forced to have a threshold voltage quite different from a correct threshold voltage. Hence, there would arise a problem that a reading may be wrong because of an incorrect threshold voltage, when data is to be read in a memory cell from which data has been erased.

As a solution to such a problem, Japanese Unexamined Patent Publication No. 4-356797 published on Dec. 10, 1992 has suggested a method in which a large capacity array is divided into several blocks, and each of the blocks shares a source line. Data erasion operation is carried out for any one of the blocks by selecting a certain source line to thereby decrease the number of cells to be erased and thus decrease dispersion in data erasion.

However, in order to carry out the above mentioned method, it is necessary to provide a semiconductor memory device with wirings and/or control circuits for erasing data from any one of the blocks. Thus, a large load is exerted on peripheral circuits, and a chip area of a semiconductor memory device is increased.

SUMMARY OF THE INVENTION

It is an object of the present invention to provide a semiconductor memory device and a method of fabricating the same both capable of overcoming the above mentioned problem about excessive erasion regardless of a dispersion in a thickness of a tunnel gate oxide film of semiconductor memory devices.

In one aspect, there is provided a semiconductor memory device including a semiconductor substrate having a first conductivity type, a floating gate formed on the semiconductor substrate, and a control gate formed on the floating gate, the semiconductor substrate including therein source and drain regions having a second conductivity type, a lightly doped region having a second conductivity type and formed so that it covers the source region, and a heavily doped region having a first conductivity type and formed so that it covers at least the drain region and it overlaps at least partially with the lightly doped region beneath the floating gate.

For instance, the above mentioned semiconductor memory device may be constituted as a non-volatile memory cell.

The heavily doped region may be formed wholly in the semiconductor substrate. Namely, the heavily doped region may be formed continuously beneath the source and drain regions and the floating gate. It is preferable that the heavily doped region has impurity concentration of $5 \times 10^{16}$ cm$^{-3}$ or greater.

In another aspect, there is provided a method of fabricating a semiconductor memory device, including the steps of (a) forming a tunnel gate oxide film, a floating gate on the tunnel gate oxide film, an oxide film on the floating gate, and a control gate on the oxide film in a device formation region on a semiconductor substrate having a first conductivity type, (b) forming a lightly doped region having a second conductivity type by implanting second conductivity type impurities into a region A which will become a source region so that at least a part of the second conductivity type impurities is diffused beneath the tunnel gate oxide film, (c) forming a heavily doped region having a first conductivity type by implanting first conductivity type impurities into a region B which will become a drain region so that at least a part of the first conductivity type impurities is diffused beneath the tunnel gate oxide film and is overlapped with the lightly doped region, and (d) forming source and drain regions having a second conductivity type by heavily implanting second conductivity type impurities into the regions A and B.

There is further provided a method of fabricating a semiconductor memory device, including the steps of (a) forming a heavily doped region having a first conductivity type at least in a device formation region of a semiconductor substrate having a first conductivity type, (b) forming a tunnel gate oxide film, a floating gate on the tunnel gate oxide film, an oxide film on the floating gate, and a control gate on the oxide film in the device formation region on the semiconductor substrate, (c) forming a lightly doped region having a second conductivity type by implanting second conductivity type impurities into a region A which will become a source region so that at least a part of the second conductivity type impurities is diffused beneath the tunnel gate oxide film, and (d) forming source and drain regions having a second conductivity type by heavily implanting second conductivity type impurities into the region A and a region which will become a drain region, respectively.

In the above mentioned semiconductor memory device and method, it is preferable that the first conductivity type is p-type and the second conductivity type is n-type. However, it should be noted that the first conductivity type may be n-type and the second conductivity type may be p-type.

In the above mentioned methods, the steps (a) to (d) are to be carried out in this order, however, it should be noted that the step (b) may be carried out after the step (d), in which case the steps are carried out in the order of (a), (c), (d) and (b). Namely, the second conductivity type heavily doped regions may be formed in a first conductivity type semiconductor substrate before forming gate oxide films and gates.

As mentioned above, the second conductivity type lightly doped region covering the source region therewith overlaps just beneath the floating gate with the first conductivity type heavily doped region covering at least the drain region. Thus, as a potential of the floating gate is increased on data erasion by virtue of F-N tunneling effect, a breakdown occurs in the overlapping region of the second conductivity type lightly doped region and the first conductivity type heavily doped region, thereby hot carriers or hot electrons generated in the overlapping region are introduced into the floating gate. Hence, it is possible to cause self-convergence of a threshold voltage. Thus, it is possible to prevent excessive erasion which would occur due to a dispersion in a thickness of tunnel gate oxide films, to thereby prevent misreadings. As a result, both of reliability for reading out data and production yield for semiconductor memory devices can be enhanced.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 6A to 6F are cross-sectional views showing respective steps of a method of fabricating a semiconductor memory device illustrated in FIG. 5.

DESCRIPTION OF THE PREFERRED EMBODIMENTS

Preferred embodiments in accordance with the present invention will be explained hereinbelow with reference to the drawings.

Figure 1:
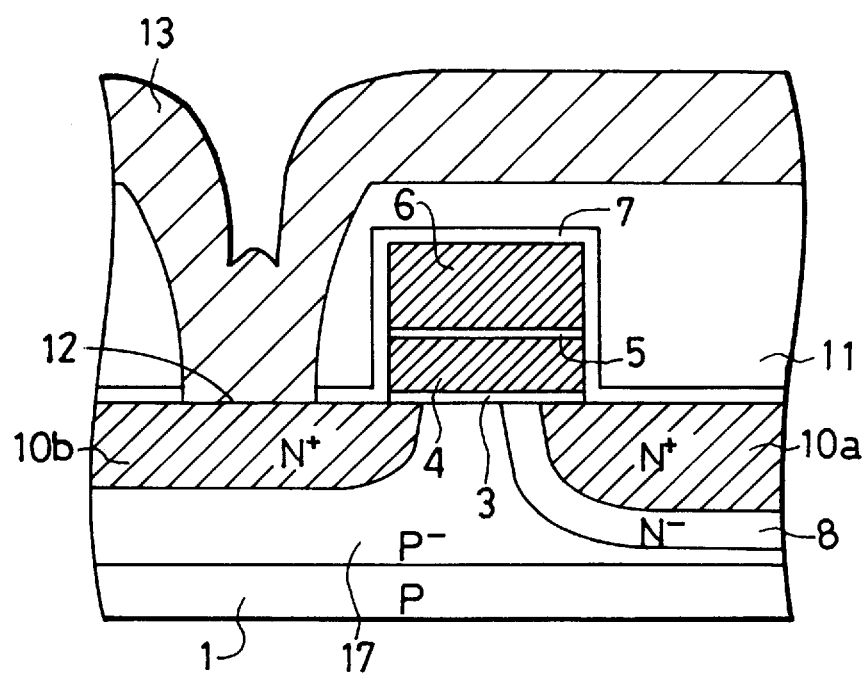
FIG. 1 is a cross-sectional view of a conventional semiconductor memory device.
Figure 2:
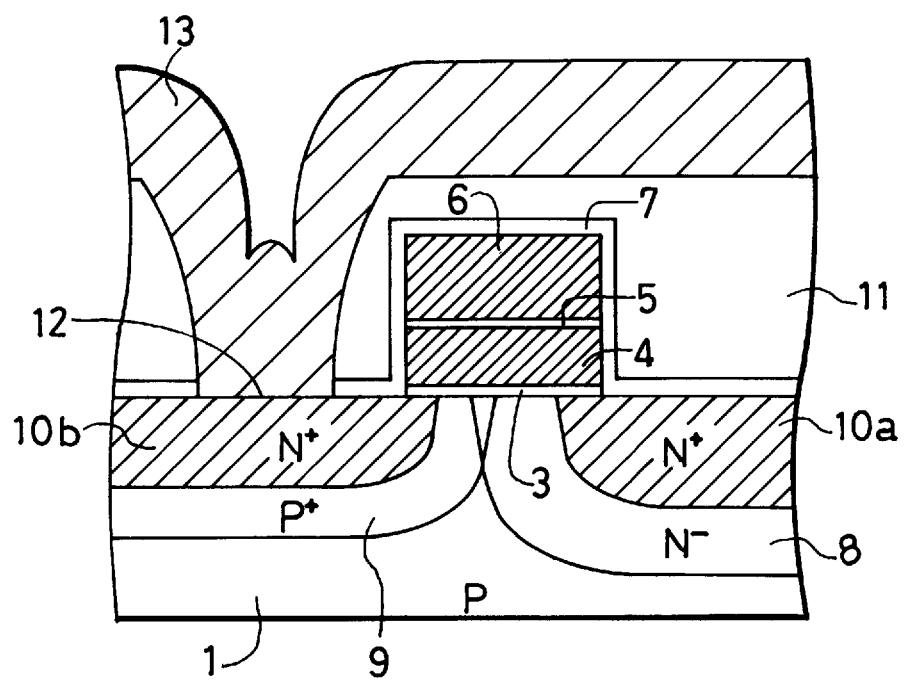
FIG. 2 is a cross-sectional view of a semiconductor memory device made in accordance with the first embodiment of the present invention.

The first embodiment is described hereinbelow with reference to FIG. 2. As illustrated, a tunnel gate oxide film 3 having a thickness of about 100 angstroms is formed on a part of a surface of a p-type silicon substrate 1. On the tunnel gate oxide film 3 is formed a layered-structure including a floating gate 4 having a thickness ranging from 1000 angstroms to 3000 angstroms and made of polysilicon into which impurities such as phosphorus are implanted, an intergate insulating film 5 having a thickness of about 250 angstroms and constituted of a layered-structure of oxide film/nitride film/oxide film, and a control gate 6 having a thickness ranging from 2000 angstroms to 4000 angstroms and having a polycide structure composed of polysilicon and refractory metal silicide.

In the p-type silicon substrate 1, there are formed heavily doped N+ diffusion layer regions 10a and 10b as source and drain regions, respectively. The N+ diffusion layer region or source region 10a is surrounded therebeneath by a lightly doped N− diffusion layer region 8, whereas the N+ diffusion layer region or drain region 10b is surrounded therebeneath by a heavily doped P+ diffusion layer region 9. The heavily doped P+ diffusion layer region 9 has impurities concentration of $5 \times 10^{16}$ cm$^{-3}$ or greater. The lightly doped N− diffusion layer region 8 overlaps at least partially with the heavily doped P+ diffusion layer region 9 beneath the tunnel gate oxide film 3.

The above mentioned layered-structure including the layers 4, 5 and 6 and a surface of the silicon substrate 1 are both covered with a thermal oxide film 7, over which is deposited an interlayer insulating film 11 including phosphorus and boron. A contact hole 12 is formed throughout the interlayer insulating film 11 and the thermal oxide film 7, and reaches a surface of the silicon substrate 1. Metal 13 such as aluminum is deposited over the interlayer insulating layer 11, filling the contact hole 12 therewith. The deposited metal 13 acts as a wiring for electrical connection.

Figure 3A:
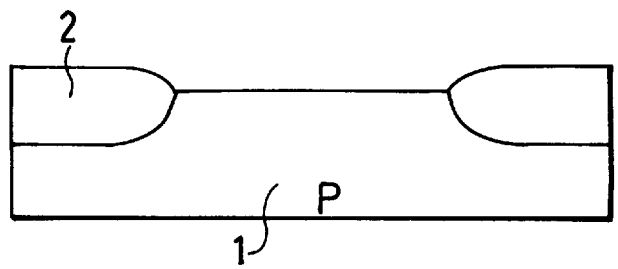
FIGS. 3A to 3G are cross-sectional views showing respective steps of a method of fabricating a semiconductor memory device illustrated in FIG. 2.
Figure 3B:
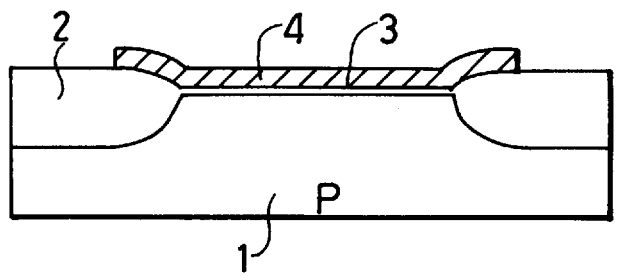

With reference to FIGS. 3A to 3G, hereinbelow is explained a method of fabricating the semiconductor memory device illustrated in FIG. 2. First, as illustrated in FIG. 3A, on the p-type silicon substrate 1 are formed field oxide films 2 having a thickness ranging from 3000 angstroms to 8000 angstroms and composed of silicon dioxide film for the purpose of isolating regions from one another, in each of which regions is to be formed an elementary memory. Then, as illustrated in FIG. 3B, there is formed a thermal oxide film, as the tunnel gate oxide film 3, having a thickness ranging from 80 to 150 angstroms in one of the regions isolated with the field oxide films 2. Then, a polysilicon film 4 having a thickness ranging from 1000 angstroms to 3000 angstroms is deposited over the tunnel gate oxide film 3 and the field oxide films 2 by means of chemical vapor deposition (CVD). Then, impurities such as phosphorus are implanted into the polysilicon film 4 at a dose ranging from about $1\times10^{14}$ to about $1\times10^{15}$ cm$^{-2}$ by means of ion implantation or thermal diffusion process. Then the polysilicon film 4 is patterned into a desired pattern to thereby form a polysilicon wiring.

Figure 3C:
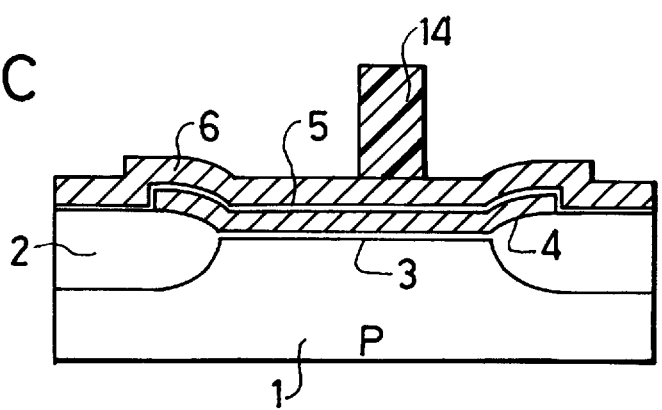

Then, as illustrated in FIG. 3C, there is formed an intergate insulating film 5 over both the patterned polysilicon film 4 and the field oxide films 2. The intergate insulating film 5 has a thickness ranging from 100 angstroms to 300 angstroms, and is composed of a layered structure of oxide film/nitride film/oxide film. There may be formed a thermal oxide film as the intergate insulating film 5 in place of the layered structure film. Then, a polysilicon film 6 is deposited over the intergate insulating film 5 by a thickness ranging from 2000 angstroms to 4000 angstroms by means of CVD. Then, impurities such as phosphorus are implanted into the polysilicon film 6 at a dose ranging from about $1\times10^{14}$ to about $1\times10^{16}$ cm$^{-2}$ by means of ion implantation or thermal diffusion process. In place of the polysilicon film 6, there may be formed a layered structure including a polysilicon film and a refractory metal silicide film such as a tungsten silicide (WSi) film. Then, on the polysilicon film 6 is formed a photoresist mask 14 shaped in a gate which is to be formed.

Figure 3D:
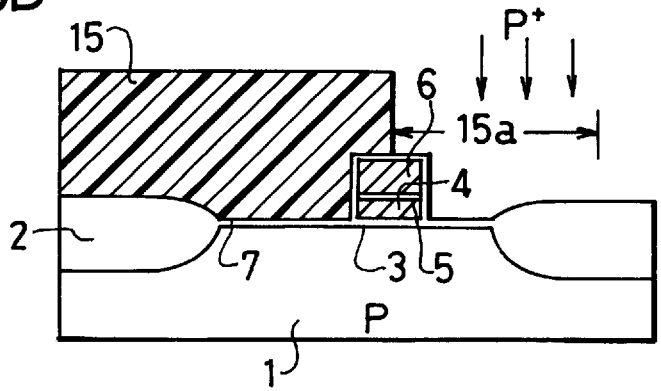

Then, as illustrated in FIG. 3D, the polysilicon film 6, the intergate insulating film 5, and the polysilicon film 4 are selectively anisotropically etched by using the photoresist mask 14 to thereby pattern an underlying floating gate 4 and an overlying control gate 6 into desired patterns. After removal of the photoresist mask 14, a thermal oxide film 7 made of a silicon dioxide film is deposited wholly over a resultant. Then, by using photolithography technique, a photoresist mask 15 is formed so that a region 15a extensive correspondingly to a source diffusion layer is open. Then, impurities such as phosphorus are implanted into the region 15a of the silicon substrate 1 at a dose ranging from about $1\times10^{14}$ to about $1\times10^{15}$ cm$^{-2}$ by using the photoresist mask 15.

Figure 3E:
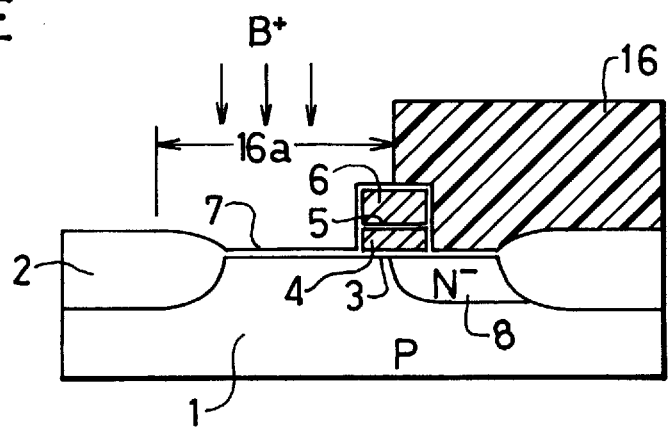

After removal of the photoresist mask 15, high temperature treatment is carried out at 900° C. to 1100° C. to thereby activate phosphorus having been implanted into the region 15a of the silicon substrate 1 so that phosphorus is diffused beneath the floating gate 4. Thus, as illustrated in FIG. 3E, there is formed the lightly doped N– diffusion layer region 8. Then, by using photolithography technique, a photoresist mask 16 is formed so that a region 16a extensive correspondingly to a drain diffusion layer is open. Then, impurities such as boron are implanted into the region 16a of the silicon substrate 1 at a dose ranging from about $5\times10^{13}$ to about $5\times10^{14}$ cm$^{-2}$ by using the photoresist mask 16.

Figure 3F:
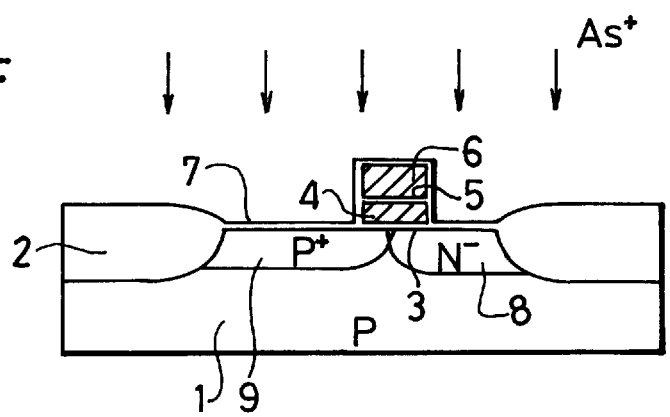
Figure 3G:
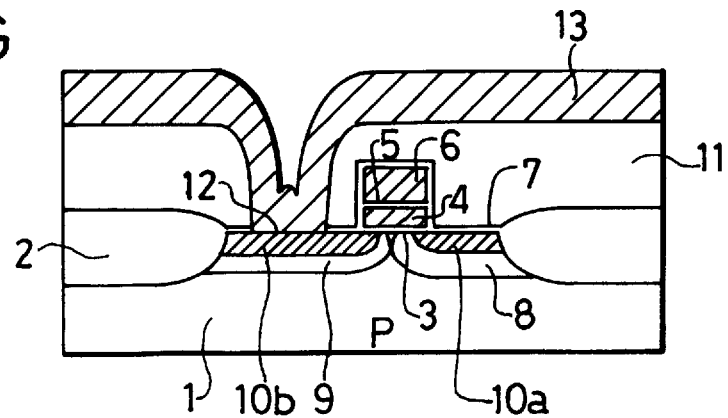

After removal of the photoresist mask 16, thermal treatment is carried out to thereby activate boron. Thus, as illustrated in FIG. 3F, there is formed the heavily doped P+ diffusion layer region 9. As mentioned earlier with reference to FIG. 2, the P+ diffusion layer region 9 has impurity concentration of $5\times10^{16}$ cm$^{-3}$, and the P+ diffusion layer region 9 is diffused just beneath the floating gate 4 so that the P+ diffusion layer region 9 overlaps the lightly doped N– diffusion layer region 8. Thereafter, impurities such as arsenic are ion-implanted into a resultant. Then, the resultant is thermally treated at 850° C. to 950° C. to thereby activate arsenic. As a result, as illustrated in FIG. 3G, there are formed the N+ diffusion layer region or source region 10a and the N+ diffusion layer region or drain region 10b.

Then, the interlayer insulating layer 11 made of silicon dioxide film containing boron and phosphorus is deposited over a resultant by means of CVD. The contact hole 12 is formed throughout the interlayer insulating layer 11 by means of lithography technique. Then, aluminum is evaporated over a resultant, and selectively etched to thereby make a desired pattern, which will act as the metal wiring 13. Thus, there is completed the semiconductor memory device illustrated in FIG. 2.

In the semiconductor memory device made in accordance with the first embodiment, the N– diffusion layer region 8 formed beneath the N+ diffusion layer region or source region 10a partially overlaps the P+ diffusion layer region 9 formed beneath the N+ diffusion layer region or drain region 10b, just beneath the floating gate 4 of the memory cell, namely just beneath the tunnel gate oxide film 3. Thus, when a high voltage, specifically about 12 V, is applied to the N+ diffusion layer region or source region 10a for data erasion, negative charges or electrons stored in the floating gate 4 are made to move into the N+ diffusion layer region or source region 10a through the tunnel gate oxide film 3 by F-N tunnel effect in an overlapping zone of the source region 10a and the floating gate 4.

Figure 4:
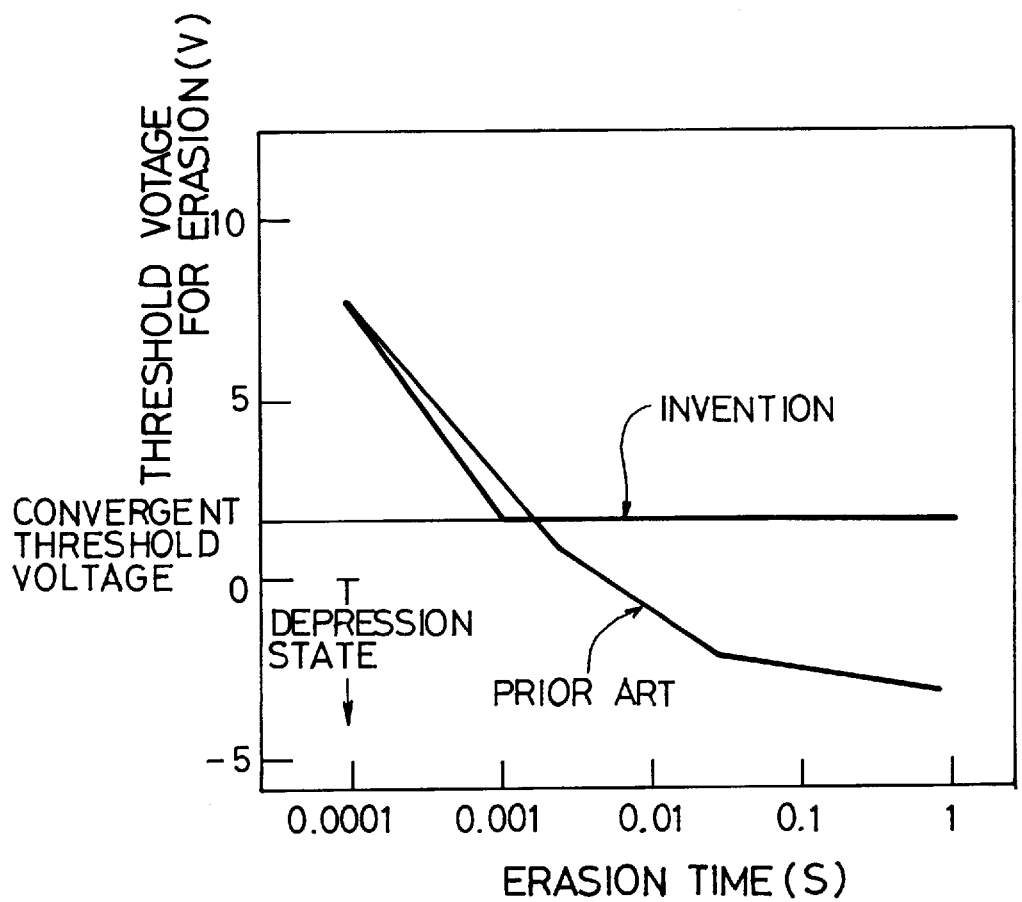
FIG. 4 is a graph showing the relationship between time required for data erasion and threshold voltages in a conventional semiconductor memory device and a semiconductor memory device made in accordance with the present invention.

However, as the above mentioned erasion operation progresses, the floating gate 4 comes to have a higher potential than an initial potential. Thus there occurs breakdown in a region where the N– diffusion layer region 8 overlaps the P+ diffusion layer region 9, thereby hot carriers, herein hot electrons, being generated and introduced into the floating gate 4. Accordingly, even if data erasion time becomes longer, a threshold voltage after data erasion can be self-converged. FIG. 4 shows the relation between time required for data erasion and threshold voltages in a conventional semiconductor memory device and a semiconductor memory device made in accordance with the present invention. A threshold voltage is lowered as data erasion time goes by in a conventional semiconductor memory device, whereas, in a semiconductor memory device made in accordance with the present invention, once after a threshold voltage has reached a convergent threshold voltage, a threshold voltage is kept almost constant at the convergent threshold voltage.

Accordingly, threshold voltages of all high capacity memory cells are converged in to a fixed voltage by continuing data erasion operation for a certain period of time until threshold voltages are self-converged. Since a self-convergent threshold voltage obtained after data erasion is dependent on a capacity ratio of a memory cell, it is able to readily control the self-convergent threshold voltage by optimizing the capacity ratio. The capacity ratio is defined in dependence on an overlapping area of the floating gate 4 and the control gate 6. The self-convergent threshold voltage is also dependent on a floating gate voltage. Thus, a threshold voltage obtained after data erasion in each of memory cells cannot be influenced by a dispersion in a thickness of tunnel gate oxide films. As a result, it is possible to prevent misreading.

In addition, it is no longer necessary to carry out verifying operation, namely threshold voltage adjustment operation of cells data of which have been erased, and hence it is possible to enhance erasing rate. Furthermore, it is also possible to lighten a load to be exerted on peripheral circuits relative to a conventional memory having cells divided into several blocks. As a result, peripheral circuits can be reduced in size.

Figure 5:
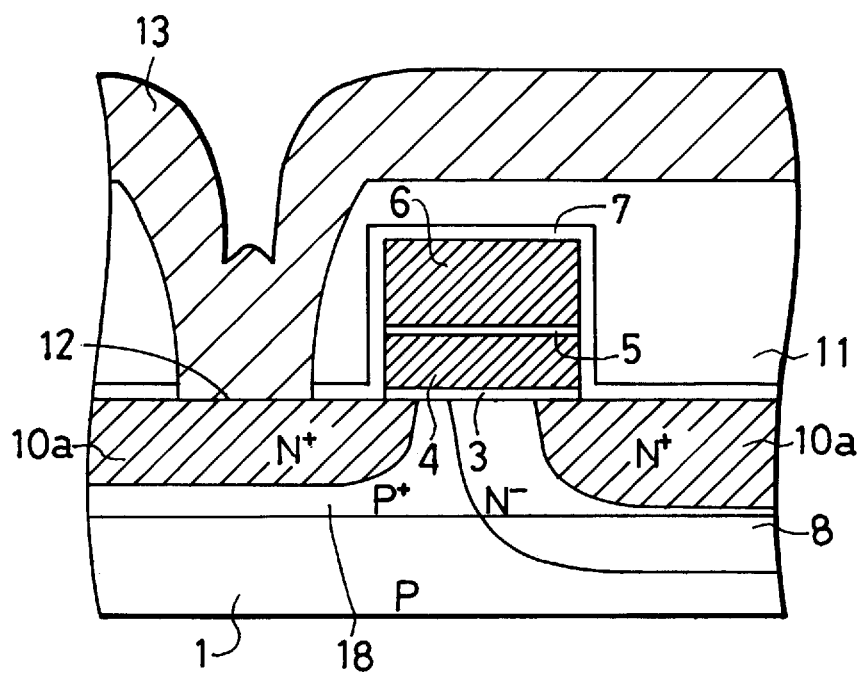
FIG. 5 is a cross-sectional view of a semiconductor memory device made in accordance with the second embodiment of the present invention.

FIG. 5 illustrates a semiconductor memory device to be made in accordance with the second embodiment of the present invention. The same or similar parts or elements that correspond to those of the first embodiment illustrated in FIG. 2 have been provided with the same reference numerals. The semiconductor memory device in accordance with the second embodiment is different from the first embodiment in that a P+ diffusion layer region 18 is formed so that it underlies not only the N+ diffusion layer region or drain region 10b, but also the N+ diffusion layer region or source region 10a, in other words, it is formed wholly in the p-type semiconductor substrate 1. Accordingly, the N− diffusion layer region 8 wholly overlaps the P+ diffusion layer region 18 at a part thereof disposed beneath the floating gate 4 and the tunnel gate oxide film 3.

Figure 6A:
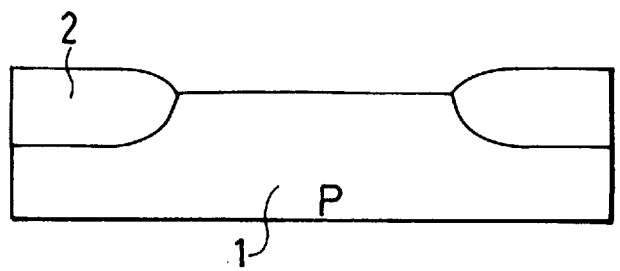
Figure 6B:
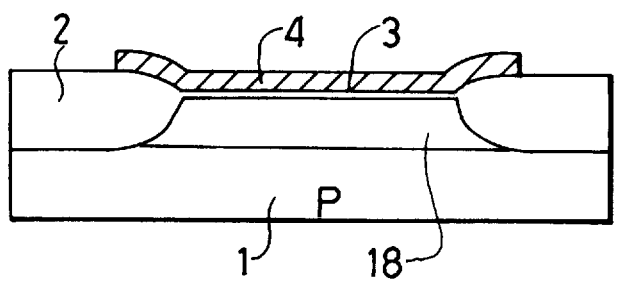

With reference to FIGS. 6A to 6F, hereinbelow is explained a method of fabricating the semiconductor memory device illustrated in FIG. 5. First, as illustrated in FIG. 6A, on the p-type silicon substrate 1 are formed field oxide films 2 having a thickness ranging from 3000 angstroms to 8000 angstroms and composed of silicon dioxide film for the purpose of isolating regions from one another, in each of which regions is to be formed an elementary memory. Then, impurities such as boron are implanted into the silicon substrate 1 at a dose of about $1 \times 10^{13}$ to about $1 \times 10^{14}$ cm$^{-2}$. Thereafter, the silicon substrate 1 is thermally treated to thereby form the P+ diffusion layer region 18 in one of the isolated region is on a surface of the silicon substrate 1, as illustrated in FIG. 6B. Then, there is formed a thermal oxide film having a thickness ranging from 80 to 150 angstroms in the isolated region. This thermal oxide film corresponds to the tunnel gate oxide film 3. Then, a polysilicon film 4 having a thickness ranging from 1000 angstroms to 3000 angstroms is deposited over the tunnel gate oxide film 3 and the field oxide films 2 by means of chemical vapor deposition (CVD). Then, impurities such as phosphorus are implanted into the polysilicon film 4 at a dose ranging from about $1 \times 10^{14}$ to about $1 \times 10^{15}$ cm$^{-2}$ by means of ion implantation or thermal diffusion process. Then the polysilicon film 4 is patterned into a desired pattern to thereby form a polysilicon wiring, as illustrated in FIG. 6B.

Figure 6C:
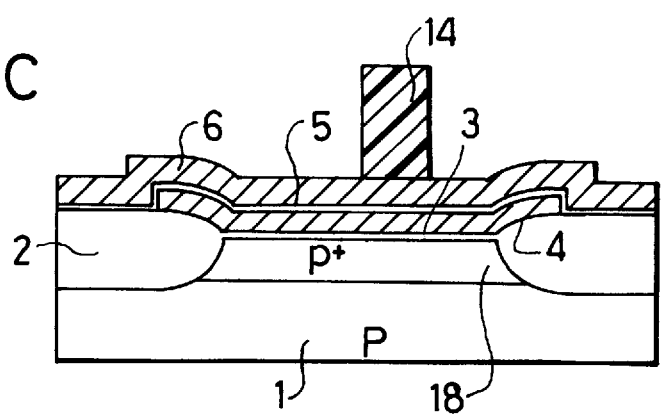

Then, as illustrated in FIG. 6C, there is formed an intergate insulating film 5 over both the patterned polysilicon film 4 and the field oxide films 2. The intergate insulating film 5 has a thickness ranging from 100 angstroms to 300 angstroms, and is composed of a layered structure of oxide film/nitride film/oxide film. There may be formed a thermal oxide film as the intergate insulating film 5 in place of the layered structure film. Then, a polysilicon film 6 is deposited over the intergate insulating film 5 by a thickness ranging from 2000 angstroms to 4000 angstroms by means of CVD. Then, impurities such as phosphorus are implanted into the polysilicon film 6 at a dose ranging from about $1 \times 10^{14}$ to about $1 \times 10^{16}$ cm$^{-2}$ by means of ion implantation or thermal diffusion process. In place of the polysilicon film 6, there may be formed a layered structure including a polysilicon film and a refractory metal silicide film such as a tungsten silicide (WSi) film, similarly to the first embodiment. Then, on the polysilicon film 6 is formed a photoresist mask 14 shaped in a gate which is to be formed.

Figure 6D:
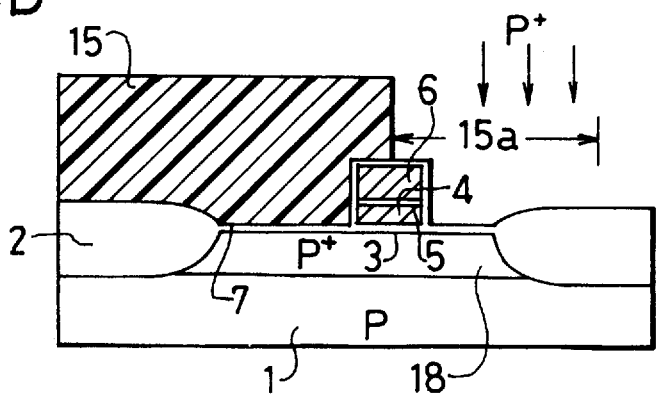

Then, as illustrated in FIG. 6D, the polysilicon film 6, the intergate insulating film 5, and the polysilicon film 4 are selectively, anisotropically etched by using the photoresist mask 14 to thereby pattern both an underlying floating gate 4 and an overlying control gate 6 into desired patterns. After removal of the photoresist mask 14, a thermal oxide film 7 made of a silicon dioxide film is deposited wholly over a resultant. Then, by using photolithography technique, a photoresist mask 15 is formed so that a region 15a extensive correspondingly to a source diffusion layer is open. Then, impurities such as phosphorus are implanted into the region 15a of the silicon substrate 1 at a dose ranging from about $1 \times 10^{14}$ to about $1 \times 10^{15}$ cm$^{-2}$ by using the photoresist mask 15.

After removal of the photoresist mask 15, high temperature treatment is carried out at 900° C. to 1100° C. to thereby activate phosphorus having been implanted into the region 15a of the silicon substrate 1 so that phosphorus is diffused beneath the floating gate 4. Thus, as illustrated in FIG. 6E, there is formed the lightly doped N− diffusion layer region 8. Thereafter, impurities such as arsenic are ion-implanted into a resultant. Then, the resultant is thermally treated at 850° C. to 950° C. to thereby activate arsenic. As a result, as illustrated in FIG. 6F, there ire formed the N+ diffusion layer region or source region 10a and the N+ diffusion layer region or drain region 10b.

Then, the interlayer insulating layer 11 made of silicon dioxide film containing boron and phosphorus therein is deposited over a resultant by means of CVD. The contact hole 12 is formed throughout the interlayer insulating layer 11 by means of lithography technique. Then, aluminum is evaporated over a resultant, and selectively etched to thereby make a desired pattern, which will act as the metal wiring 13. Thus, there is completed the semiconductor memory device illustrated in FIG. 5.

Similarly to the first embodiment, in the semiconductor memory device made in accordance with the second embodiment, the N− diffusion layer region 8 formed beneath the N+ diffusion layer region or source region 10a partially overlaps the P+ diffusion layer region 18 just beneath the floating gate 4, namely just beneath the tunnel gate oxide film 3. Thus, when a high voltage, specifically about 12 V, is applied to the N+ diffusion layer region or source region 10a for data erasion, negative charges or electrons stored in the floating gate 4 are made to move into the N+ diffusion layer region or source region 10a through the tunnel gate oxide film 3 by F-N tunnel effect in an overlapping zone of the source region 10a and the floating gate 4. Thus, data erasion is accomplished. As the above mentioned erasion operation progresses, the floating gate 4 comes to have a higher potential than an initial potential. Thus there occurs breakdown in a region where the N− diffusion layer region 8 overlaps the P+ diffusion layer region 18, thereby hot carriers, herein hot electrons, being generated and introduced into the floating gate 4. Accordingly, even if data erasion time becomes longer, a threshold voltage after data erasion can be self-converged. Accordingly, threshold voltages of all high capacity memory cells are converged into a fixed voltage by continuing data erasion operation for a certain period of time until threshold voltages are self-converged.

It is unnecessary to carry out photolithography for the formation of the P+ diffusion layer region 9 in the second embodiment, and the formation of the P+ diffusion layer region 9 is not influenced by cell gate shape. Thus, it is possible to uniformly form a P+ diffusion layer region relative to the first embodiment, thereby enhancing production yield.

Though the specific conductivity types are used in the above described two embodiments, it should be noted that p- and n-types may be replaced with n- and p-types, respectively. Such replacement would provide the same advantages as those of the above described embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor memory device comprising:

a semiconductor substrate having a first conductivity type;

a floating gate formed on said semiconductor substrate; and a control gate formed on said floating gate;

said semiconductor substrate including therein:

source and drain regions having a second conductivity type;

a lightly doped region having a second conductivity type and formed so that it covers said source region; and a heavily doped region having a first conductivity type, said heavily doped region being structured and arranged to converge a threshold voltage of said floating gate to a predetermined positive voltage during data erasure by covering said drain region and overlapping at least part of said lightly doped region beneath said floating gate, wherein said overlapping parts of said heavily doped region and said lightly doped region are located only beneath a center portion of said floating gate.

2. The semiconductor memory device as set forth in claim 1, wherein said heavily doped region is formed wholly in said semiconductor substrate.

3. The semiconductor memory device as set forth in claim 1, wherein said heavily doped region has impurity concentration of $5\times10^{16}$ cm$^{-3}$ or greater.

4. The semiconductor memory device as set forth in claim 2, wherein said heavily doped region has impurity concentration of $5\times10^{16}$ cm$^{-3}$ or greater.

5. The semiconductor memory device as set forth in claim 1, wherein said first conductivity type is p-type and said second conductivity type is n-type.

6. The semiconductor memory device as set forth in claim 2, wherein said first conductivity type is p-type and said second conductivity type is n-type.

7. The semiconductor memory device as set forth in claim 1, wherein said first conductivity type is n-type and said second conductivity type is p-type.

8. The semiconductor memory device as set forth in claim 2, wherein said first conductivity type is n-type and said second conductivity type is p-type.

9. The semiconductor memory device as set forth in claim 1, wherein said semiconductor memory device constitutes a non-volatile memory cell.

10. A semiconductor memory device comprising:

a semiconductor substrate having a first conductivity type;

a floating gate formed on said semiconductor substrate; and a control gate formed on said floating gate;

said semiconductor substrate including therein:

source and drain regions having a second conductivity type;

a lightly doped region having a second conductivity type and formed so that it covers said source region; and a heavily doped region having a first conductivity type, said heavily doped region being structured and arranged to converge a threshold voltage of said floating gate to a predetermined positive voltage during data erasure by covering said drain region and overlapping at least part of said lightly doped region beneath said floating gate, wherein said heavily doped region is thinner than said lightly doped region beneath said source and drain regions.

11. The device of claim 10, wherein said heavily doped region is thinner than said lightly doped region beneath said floating gate.

12. The device of claim 10, wherein said more heavily doped region is thicker than said lightly doped region beneath said floating gate.

* * * * *